United States Patent
Nguyen et al.

(10) Patent No.: US 7,863,941 B1
(45) Date of Patent: Jan. 4, 2011

(54) TECHNIQUES FOR CANCELING OFFSETS IN DIFFERENTIAL CIRCUITS

(75) Inventors: Toan Thanh Nguyen, San Clara, CA (US); Thungoc M. Tran, San Jose, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/365,585

(22) Filed: Feb. 4, 2009

(51) Int. Cl.
  *H03K 5/22* (2006.01)
(52) U.S. Cl. .......................... 327/67; 327/55
(58) Field of Classification Search ............. 327/52–57, 327/63–71
  See application file for complete search history.

(56) References Cited

U.S. PATENT DOCUMENTS

| | | | |
|---|---|---|---|
| 4,508,980 A * | 4/1985 | Puar | 327/57 |
| 5,510,745 A * | 4/1996 | Hamano et al. | 327/333 |
| 5,673,001 A | 9/1997 | Kim et al. | |
| 5,955,929 A * | 9/1999 | Moon et al. | 331/57 |
| RE37,739 E * | 6/2002 | Sutardja et al. | 327/336 |
| 6,870,404 B1 * | 3/2005 | Maangat | 327/65 |
| 7,151,411 B2 | 12/2006 | Martin et al. | |
| 7,202,726 B2 * | 4/2007 | Kunanayagam et al. | 327/274 |
| 7,205,813 B2 * | 4/2007 | Kang | 327/287 |
| 7,295,143 B2 | 11/2007 | Ambo et al. | |
| 7,323,939 B2 | 1/2008 | Han et al. | |
| 7,397,848 B2 | 7/2008 | Stojanovic et al. | |
| 7,589,596 B2 * | 9/2009 | Masuda et al. | 331/36 C |
| 7,652,600 B2 * | 1/2010 | Van der Plas et al. | 341/120 |
| 2004/0212741 A1 * | 10/2004 | Hijikata et al. | 348/707 |
| 2006/0280239 A1 * | 12/2006 | Moll et al. | 375/224 |
| 2006/0284670 A1 * | 12/2006 | Eid et al. | 327/563 |
| 2010/0194621 A1 * | 8/2010 | Mizoguchi et al. | 341/172 |

OTHER PUBLICATIONS

Joyce Yeung et al., "Robust Sense Amplifier Design under Random Dopant Fluctuations in Nano-Scale CMOS Technologies," IEEE, 2006, pp. 261-264.

* cited by examiner

*Primary Examiner*—Lincoln Donovan
*Assistant Examiner*—William Hernandez
(74) *Attorney, Agent, or Firm*—Steven J. Cahill

(57) ABSTRACT

A circuit includes a differential circuit that generates a differential output signal at first and second output nodes. The circuit also includes a first variable capacitor coupled to the first output node of the differential circuit, and a second variable capacitor coupled to the second output node of the differential circuit. A control circuit controls capacitances of the first and the second variable capacitors in response to a measurement of the differential output signal.

23 Claims, 7 Drawing Sheets

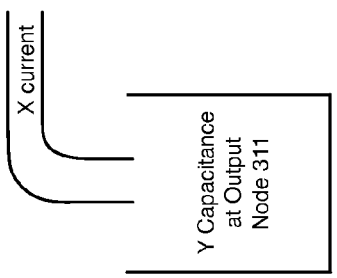
FIG. 4A
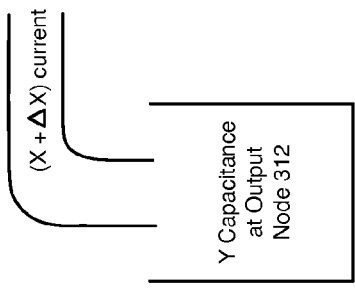
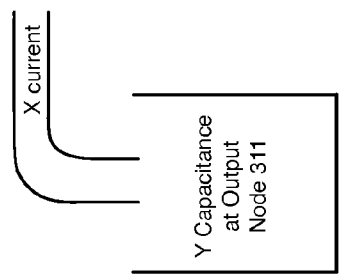
FIG. 4B
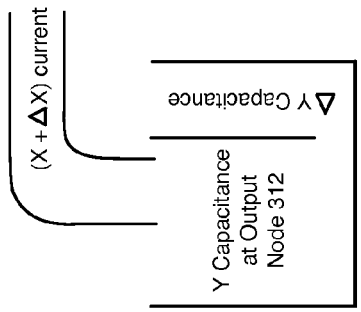

TECHNIQUES FOR CANCELING OFFSETS IN DIFFERENTIAL CIRCUITS

BACKGROUND OF THE INVENTION

The present invention relates to electronic circuits, and more particularly, to techniques for canceling offsets in differential circuits.

FIG. 1 illustrates a prior art differential sense amplifier 100. Sense amplifier 100 includes p-channel metal oxide semiconductor field-effect transistors (MOSFETs) 101-105 and n-channel MOSFETs 106-110. Input voltage signals IN and INB are transmitted to the gates of differential pair transistors 108 and 109, respectively. A digital periodic clock signal CLK is transmitted to the gates of transistors 101, 102, 105, and 110. Output voltage OUTB is generated at the drains of transistors 103 and 106, and output voltage OUT is generated at the drains of transistors 104 and 107.

When clock signal CLK is in a logic high state, transistor 110 is on, and transistors 101, 102, and 105 are off. Sense amplifier 100 amplifies the differential input voltage between IN and INB to generate a differential output voltage between OUT and OUTB when clock signal CLK is in a logic high state. When clock signal CLK is in a logic low state, transistor 110 is off. Also when CLK is low, transistors 101, 102, and 105 are on, pulling both of the output voltages OUT and OUTB to supply voltage VCC. Sense amplifier 100 is disabled when CLK is low.

BRIEF SUMMARY OF THE INVENTION

According to an embodiment of the present invention, a circuit includes a differential circuit that generates a differential output signal at first and second output nodes. The circuit also includes a first variable capacitor coupled to the first output node of the differential circuit, and a second variable capacitor coupled to the second output node of the differential circuit. A control circuit controls capacitances of the first and the second variable capacitors in response to a measurement of the differential output signal.

According to another embodiment of the present invention, a circuit includes an amplifier that generates a differential output signal at first and second output nodes, a first variable capacitor coupled between the first output node of the amplifier and a node that receives a ground voltage, and a second variable capacitor coupled between the second output node of the amplifier and the node that receives the ground voltage.

Various objects, features, and advantages of the present invention will become apparent upon consideration of the following detailed description and the accompanying drawings.

BRIEF DESCRIPTION OF THE DRAWINGS

FIGS. 4A-4B are diagrams that illustrate an example of how the variable capacitors of the sense amplifier can compensate for a mismatch in the current through the differential pair of transistors, according to an embodiment of the present invention.

DETAILED DESCRIPTION OF THE INVENTION

In some high-speed systems, the differential input voltage to a receiver is very small. The receiver often cannot recover a very small differential input signal to generate an output voltage that varies between the supply voltage and ground. In systems that have a clock data recovery (CDR) circuit, a differential sense amplifier in the CDR circuit receives the data from the output terminals of the receiver. The differential sense amplifier attempts to recover the data one more time before the sense amplifier sends the data to the core of the CDR circuit.

Process variations are caused by variations in a semiconductor fabrication process that affect characteristics of circuit elements on an integrated circuit. Global process variations refer to variations between different integrated circuit dies that are fabricated with the same process and architecture. Local process variations refer to variations between circuit elements on the same integrated circuit. Often, local or global process variations within the receiver circuit can cause the receiver circuit to have an offset. An offset in the receiver may cause the receiver to flip the polarity of its output signal and send incorrect data to the clock data recovery circuit. The sense amplifier may also have an offset caused by local process variations. An offset in the sense amplifier may cause the sense amplifier to flip the polarity of its output signal.

As the transistor gates are reduced to the sub-micron level, mismatches in the transistors in the receiver and in the sense amplifier that are caused by local process variations become more significant. Local process variations may cause a variety of a transistor's features to vary from ideal values. For example, local process variations may cause the channel length, channel width, or doping concentrations of transistors to vary within a single integrated circuit. Local process variations can affect the threshold voltages of the transistors in the receiver and in the sense amplifier. Local process variations can also cause a mismatch in the current going through the differential pair of transistors in the sense amplifier. In a high-speed sense amplifier, the differential input voltage is very small. A small mismatch in current may cause the output signal to trip to the opposite polarity, generating incorrect output data.

Figure 1:
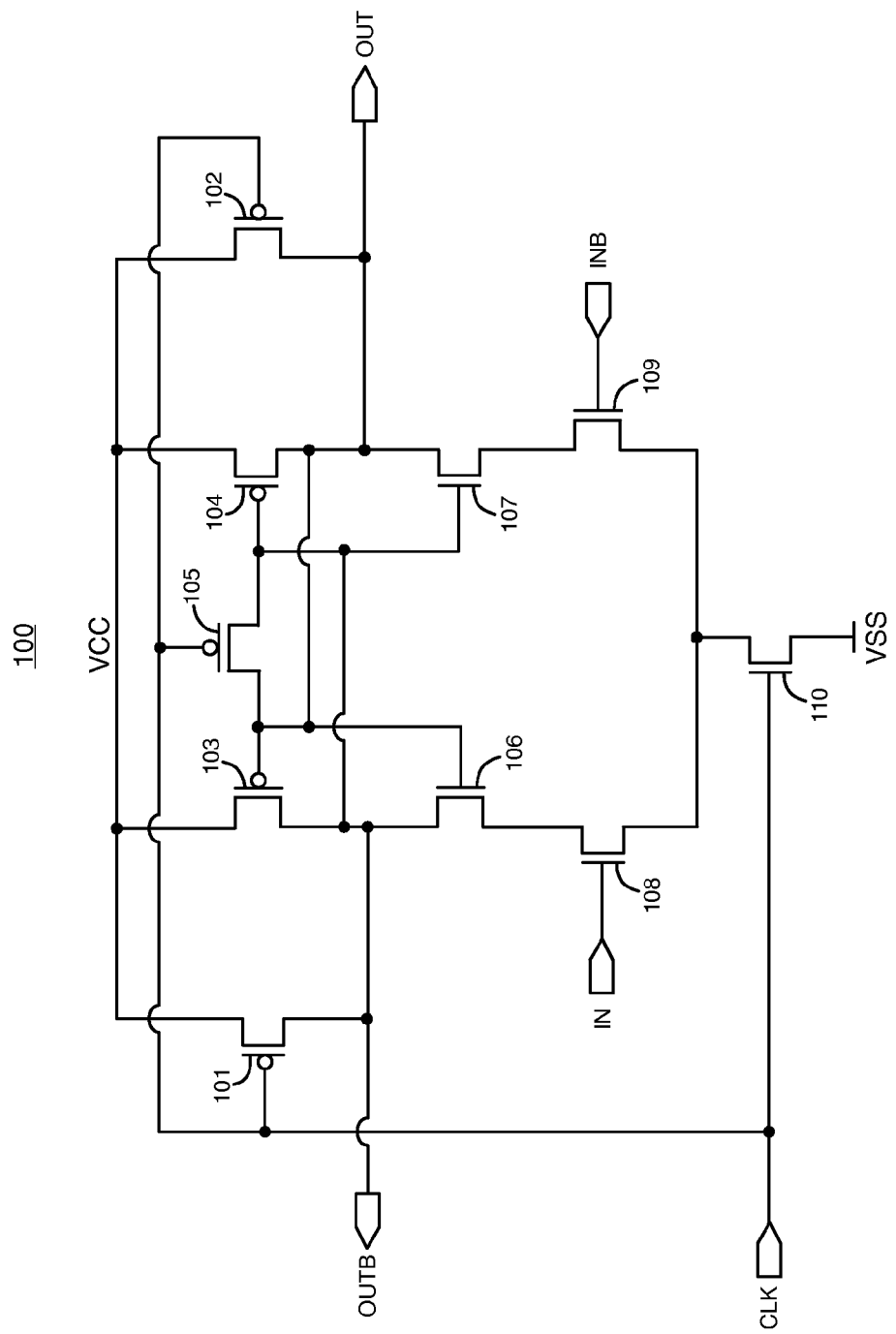
FIG. 1 illustrates a prior art differential sense amplifier.
Figure 2:
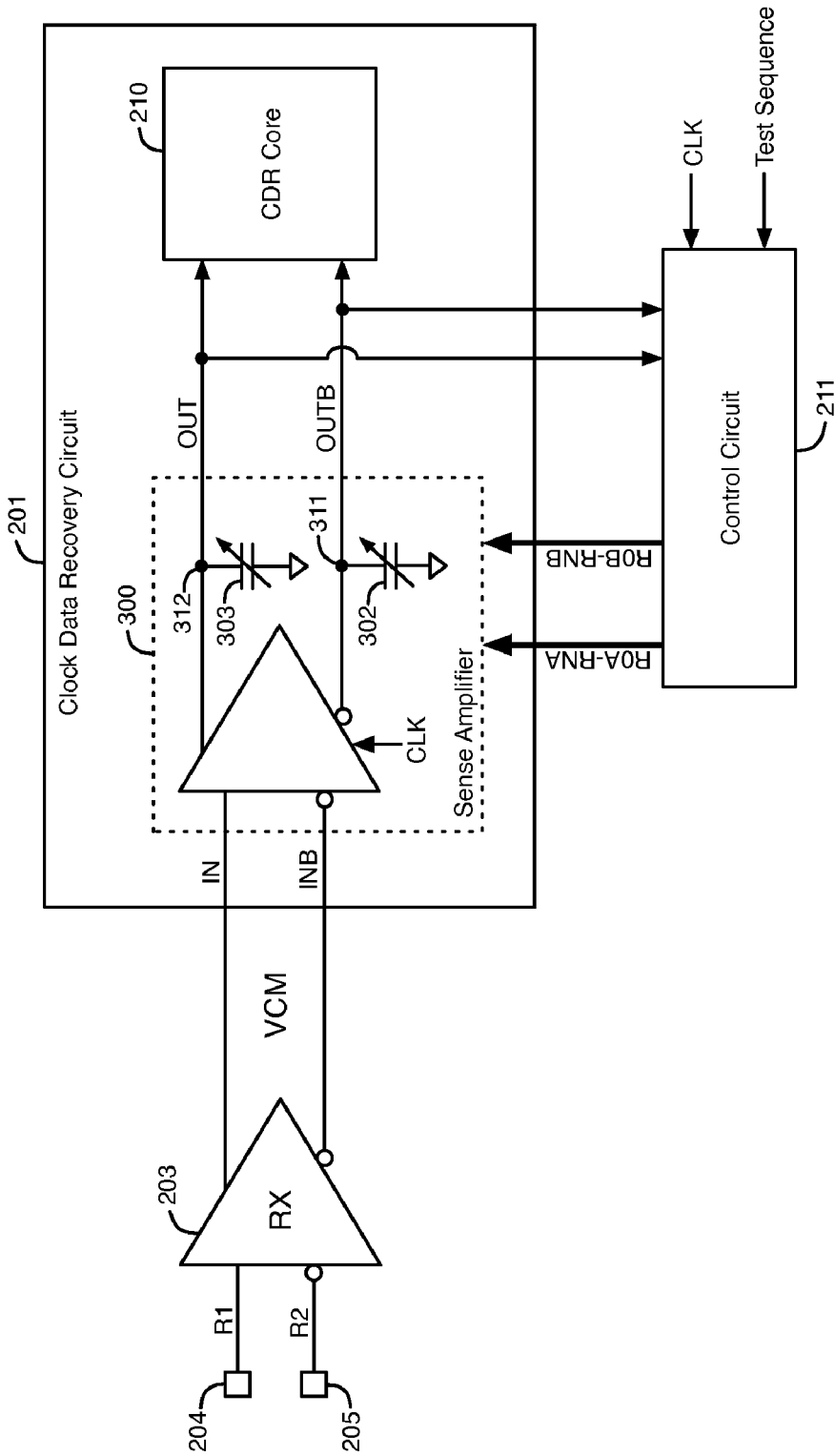
FIG. 2 illustrates circuitry that cancels the effect of any offset that causes an incorrect logic state in the differential output signal of a sense amplifier, according to an embodiment of the present invention.

FIG. 2 illustrates circuitry that cancels the effect of any offset that causes an incorrect logic state in the differential output signal of the sense amplifier, according to an embodiment of the present invention. FIG. 2 illustrates a signal path from receiver (RX) circuit 203 to sense amplifier circuit 300. The sense amplifier 300 is part of a phase detector in a clock data recovery circuit 201. The circuitry shown in FIG. 2 is typically fabricated on an integrated circuit, such as a programmable logic integrated circuit or an application specific integrated circuit.

Receiver (RX) circuit 203 receives a differential input signal R1/R2 from input pads 204 and 205. Voltage R1 is applied to pad 204, and voltage R2 is applied to pad 205. Pads 204 and 205 are external terminals of the integrated circuit. Receiver 203 includes an amplifier circuit that amplifies the differential input signal R1/R2 received from pads 204 and 205 to generate intermediate differential signal IN/INB that is transmitted to the input terminals of sense amplifier 300. The common mode voltage of differential signal IN/INB is VCM.

Sense amplifier 300 amplifies intermediate differential signal IN/INB to generate a differential output signal OUT/OUTB. Output voltage OUT is generated at output node 312 of amplifier 300, and output voltage OUTB is generated at output node 311 of amplifier 300. The differential output signal OUT/OUTB of sense amplifier 300 is transmitted to clock data recovery (CDR) core circuitry 210. CDR core 210 includes additional phase detector circuitry, a charge pump, a loop filter, and a voltage-controlled oscillator that are coupled together in a feedback loop.

Sense amplifier 300 is designed to detect a very small differential input voltage, e.g., a few millivolts. However, if the differential input signal R1/R2 received at pads 204 and 205 is a very small voltage (e.g., 5 millivolts), an offset in receiver 203 or an offset in sense amplifier 300 may cause differential output signal OUT/OUTB to be in an incorrect logic state relative to the logic state of differential input signal R1/R2.

According to an embodiment of the present invention, two variable capacitors 302 and 303 and a control circuit 211 cancel the effect of any offset in receiver 203 or sense amplifier 300 that causes the polarity of differential output signal OUT/OUTB to be in an incorrect logic state relative to the polarity of differential signal R1/R2. As shown in FIG. 2, sense amplifier 300 includes variable capacitors 302 and 303. Variable capacitor 303 is coupled to output node 312 where output signal OUT is generated. Variable capacitor 302 is coupled to output node 311 where output signal OUTB is generated.

Differential output signal OUT/OUTB is transmitted to input terminals of control circuit 211. A clock signal CLK and a test sequence are also transmitted to control circuit 211. The test sequence is a digital sequence representing the pattern of digital signals that will be applied to pads 204 and 205 as differential input signal R1/R2 during tests of sense amplifier 300. According to one embodiment, the tests are performed to determine if the logic state of OUT/OUTB matches the logic state of R1/R2 for both possible logic states of R1/R2.

Control circuit 211 generates control signals R0A-RNA and R0B-RNB. Control signals R0A-RNA are transmitted to variable capacitor 302, and control signals R0B-RNB are transmitted to variable capacitor 303. Control signals R0A-RNA control the capacitance of variable capacitor 302, and control signals R0B-RNB control the capacitance of variable capacitor 303.

After the differential input signal R1/R2 is applied to pads 204 and 205, control circuit 211 compares the differential output signal OUT/OUTB of sense amplifier 300 to the test sequence to determine if they have the same logic states (e.g., using an XOR logic gate). If an offset causes differential output signal OUT/OUTB and the test sequence to have different logic states, control circuit 211 changes the capacitance of one or both of variable capacitors 302-303 in order to cancel the effect of the offset so that the logic states of differential output signal OUT/OUTB are the same as corresponding logic states of the test sequence representing differential input signal R1/R2. Control circuit 211 can increase or decrease the capacitance of variable capacitor 302 by varying the logic states of signals R0A-RNA. Control circuit 211 can increase or decrease the capacitance of variable capacitor 303 by varying the logic states of signals R0B-RNB. Control circuit 211 can be, for example, a state machine that is implemented by configuring programmable logic blocks (i.e., soft IP) on a field programmable gate array (FPGA).

Figure 3:
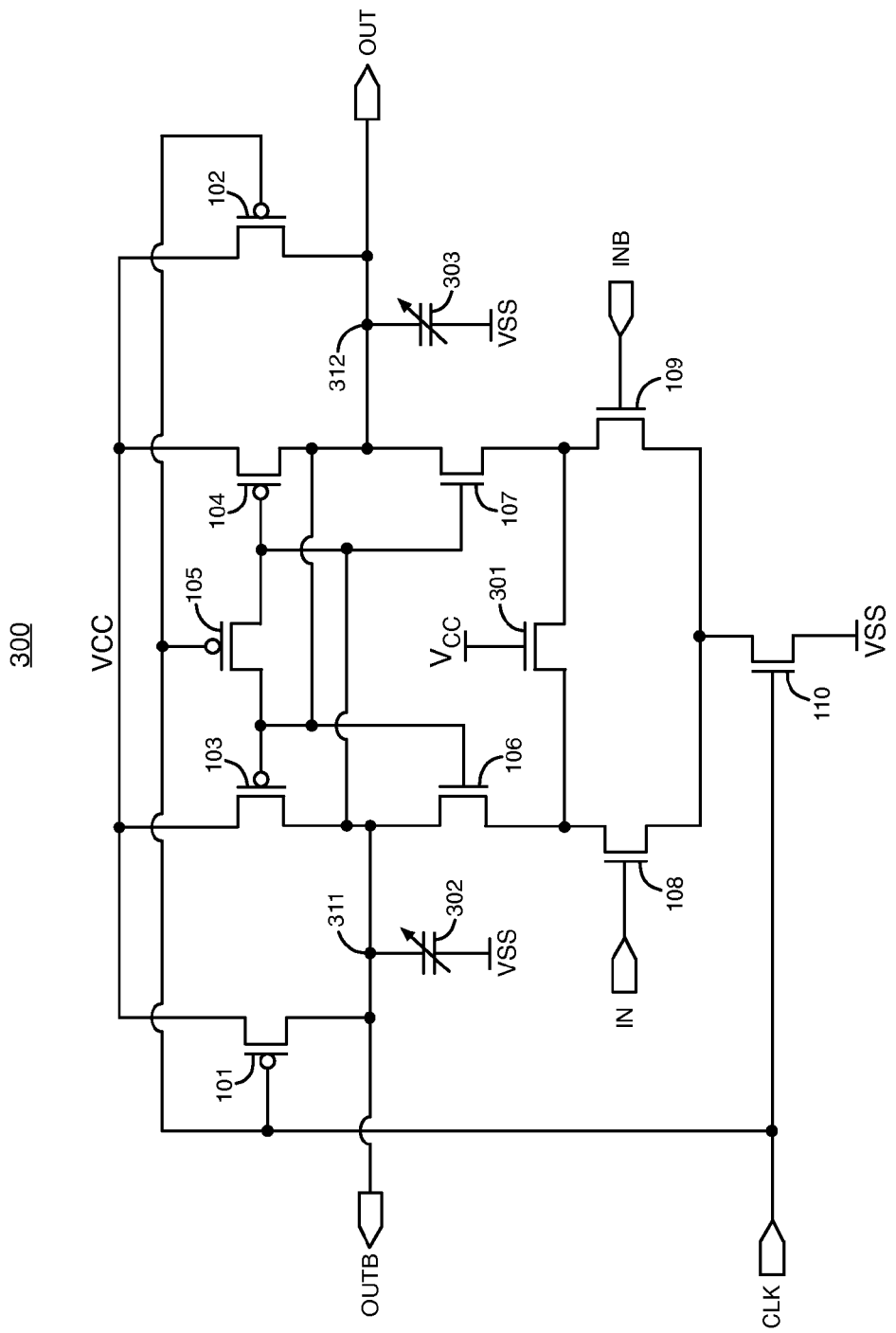
FIG. 3 illustrates an example of a circuit configuration for a differential sense amplifier that includes variable capacitors at its differential output terminals, according to an embodiment of the present invention.

Sense amplifier 300 can have any suitable circuit configuration. FIG. 3 illustrates one particular example of a circuit configuration for differential sense amplifier 300 that includes variable capacitors at its differential output terminals, according to an embodiment of the present invention. The circuit configuration of sense amplifier 300 shown in FIG. 3 is not intended to limit the scope of the present invention. Techniques of the present invention described herein can also be applied to other types of differential circuits having other circuit configurations, including amplifier circuits having other circuit configurations and differential circuits that are not amplifiers.

Differential sense amplifier 300 shown in FIG. 3 includes p-channel MOSFETs 101-105, n-channel MOSFETs 106-110 and 301, and variable capacitors 302-303. Differential input voltage IN is transmitted to the gate of transistor 108. Differential input voltage INB is transmitted to the gate of transistor 109. Transistors 108 and 109 form a differential pair. N-channel transistor 301 is coupled between the drains of transistors 108 and 109. The gate of transistor 301 is coupled to receive supply voltage VCC. Transistor 301 is maintained on at all times during the operation of sense amplifier 300 to discharge a small amount of leakage current. Transistor 110 is coupled between the sources of transistors 108-109 and a node that is at a ground voltage VSS. Variable capacitor 302 is coupled between output node 311 and the node that is at ground voltage VSS. Variable capacitor 303 is coupled between output node 312 and the node that is at ground voltage VSS.

P-channel transistor 103 and n-channel transistor 106 form a first inverter circuit. The source of transistor 103 is coupled to a node that is at supply voltage VCC, and the source of transistor 106 is coupled to the drain of transistor 108. P-channel transistor 104 and n-channel transistor 107 form a second inverter circuit. The source of transistor 104 is coupled to the VCC node, and the source of transistor 107 is coupled to the drain of transistor 109.

The first inverter formed by transistors 103/106 is cross-coupled with the second inverter formed by transistors 104/107. The output terminal of the first inverter is coupled to the input terminal of the second inverter, and the output terminal of the second inverter is coupled to the input terminal of the first inverter. The gates of transistors 103 and 106 are coupled to the drains of transistors 104 and 107, and the gates of transistors 104 and 107 are coupled to the drains of transistors 103 and 106.

A digital periodic clock signal CLK is transmitted to the gates of transistors 101, 102, 105, and 110. When clock signal CLK is in a logic low state, transistor 110 is off, transistors 101, 102, and 105 are on, and sense amplifier 300 is disabled. Current flow through transistors 103-104 and 106-109 shuts off when transistor 110 is off. When transistors 101 and 102 are on, the output voltages OUT and OUTB are pulled to supply voltage VCC. When transistor 105 is on, the gates of transistors 103 and 104 have the same voltages, and the output voltages OUT and OUTB are the same. Initially, transistor 105 is turned on to cause both of the output voltages OUT and OUTB to be at supply voltage VCC prior to the operation of sense amplifier 300.

When clock signal CLK is in a logic high state, transistor 110 is on, transistors 101, 102, and 105 are off, and sense amplifier 300 is enabled. Current flows through at least one of transistors 108 and 109 when transistor 110 is on. When transistors 101 and 102 are off, the differential output voltages OUT and OUTB are allowed to vary between the supply voltage VCC and the ground voltage VSS.

When input voltage IN is greater than input voltage INB while CLK is high, transistor 108 ideally conducts more current than transistor 109. Current flow through transistor 106 pulls the voltage OUTB at the gates of transistors 104 and 107 closer to VSS, increasing current flow through transistor 104. As transistor 104 draws current from the supply voltage, the voltage OUT at the gates of transistors 103 and 106 increases closer to VCC, causing the current through transistor 106 to increase further. As a result, the output voltage OUT rapidly increases to VCC, and the output voltage OUTB rapidly decreases to VSS.

When input voltage IN is less than input voltage INB while CLK is high, transistor 109 ideally conducts more current than transistor 108. Current flow through transistor 107 pulls the voltage OUT at the gates of transistors 103 and 106 closer to VSS, increasing current flow through transistor 103. As transistor 103 draws current from the supply voltage, the voltage OUTB at the gates of transistors 104 and 107 increases closer to VCC, causing the current through transistor 107 to increase further. As a result, the output voltage OUTB rapidly increases to VCC, and the output voltage OUT rapidly decreases to VSS. Thus, sense amplifier 300 generates rail-to-rail output voltages OUT and OUTB that vary between supply voltage VCC and ground voltage VSS.

Ideally, transistors 101 and 102 are the same size, transistors 103 and 104 are the same size, transistors 106 and 107 are the same size, and transistors 108 and 109 are the same size. However, in some integrated circuit dies that have sense amplifier 300, local process variations may cause the capacitance at output node 311 to be different than the capacitance at node 312. Specifically, local process variations may cause the sum of the drain capacitance of transistor 106, the drain capacitance transistor 101, the drain capacitance of transistor 103, the gate capacitance of transistor 104, plus the gate capacitance of transistor 107 at node 311 to be different than the sum of the drain capacitance of transistor 107, the drain capacitance of transistor 104, the drain capacitance of transistor 102, the gate capacitance of transistor 103, plus the gate capacitance of transistor 106 at node 312.

In addition, local process variations may cause the width-to-length channel ratio of transistor 108 to be different than the width-to-length channel ratio of transistor 109. If the width-to-length channel ratio of one of transistors 108/109 is larger than the other transistor 108/109, then the transistor with the larger width-to-length channel ratio conducts more drain current in response to the same gate-to-source voltage.

A mismatch in the capacitances at nodes 311 and 312 or a mismatch between the width-to-length channel ratios of transistors 108 and 109 may cause sense amplifier 300 to flip the polarity of the differential output signal represented by output voltages OUT and OUTB relative to the polarity of the differential input signal represented by input voltages IN and INB. When the polarity of the differential output signal OUT/OUTB is flipped relative to the polarity of the differential input signal IN/INB, the polarity of the differential output signal OUT/OUTB may be incorrect.

Control circuit 211 can vary the capacitances of variable capacitors 302 and 303 to cancel a mismatch between the capacitances at output nodes 311 and 312 that cause the logic state of OUT/OUTB to be different than the logic state of R1/R2. For example, if the capacitance of transistors 101 and 103-107 at node 311 is greater than the capacitance of transistors 102-107 at node 312, then control circuit 211 can increase the capacitance of variable capacitor 303 to cause the total capacitances at nodes 311 and 312 to be equal or at least closer to being equal. As another example, if the capacitance of transistors 102-107 at node 312 is greater than the capacitance of transistors 101 and 103-107 at node 311, then control circuit 211 can increase the capacitance of variable capacitor 302 to cause the total capacitances at nodes 311 and 312 to be equal or at least closer to being equal.

Control circuit 211 can also vary the capacitances of variable capacitors 302 and 303 to cancel the effect of a mismatch between the width-to-length channel ratios of transistors 108 and 109 that causes the logic state of OUT/OUTB to be different than the logic state of R1/R2. For example, if the width-to-length channel ratio of transistor 108 is greater than the width-to-length channel ratio of transistor 109, control circuit 211 can increase the capacitance of variable capacitor 302 to cause the resistor/capacitor (RC) time constant at output node 311 to be the same as, or at least closer to, the RC time constant at output node 312. As another example, if the width-to-length channel ratio of transistor 109 is greater than the width-to-length channel ratio of transistor 108, control circuit 211 can increase the capacitance of variable capacitor 303 to cause the RC time constant at output node 312 to be the same as, or at least closer to, the RC time constant at output node 311.

FIGS. 4A-4B are diagrams that illustrate an example of how the variable capacitors of sense amplifier 300 can compensate for a mismatch in the current through differential pair transistors 108 and 109, according to an embodiment of the present invention. In the example illustrated in FIGS. 4A-4B, the width-to-length channel ratio of transistor 108 is less than the width-to-length channel ratio of transistor 109. As a result, the drain current (X current) through transistor 108 is less than the drain current through transistor 109 ((X+ΔX) current) in response to the same gate-to-source voltage, as shown in FIGS. 4A-4B. Control circuit 211 increases the capacitance of variable capacitor 303 to ΔY to compensate for the mismatch in the width-to-length channel ratios of transistors 108-109. As a result, the total capacitance at output node 312 is increased from a capacitance of Y to a capacitance of (Y+ΔY), as shown in FIG. 4B. The increase ΔY in the capacitance at output node 312 is selected to cause the RC time constants at nodes 311 and 312 to be equal or approximately equal.

Control circuit 211 can change the capacitances of variable capacitors 302 and 303 to compensate for mismatches between other device characteristics of transistors 108 and 109 (e.g., the gate oxide capacitance per unit area). Control circuit 211 can also vary the capacitances of variable capacitors that are coupled to the output nodes of other differential sense amplifiers on the same integrated circuit to cancel the effects of any offsets on these differential sense amplifiers.

Figure 5:
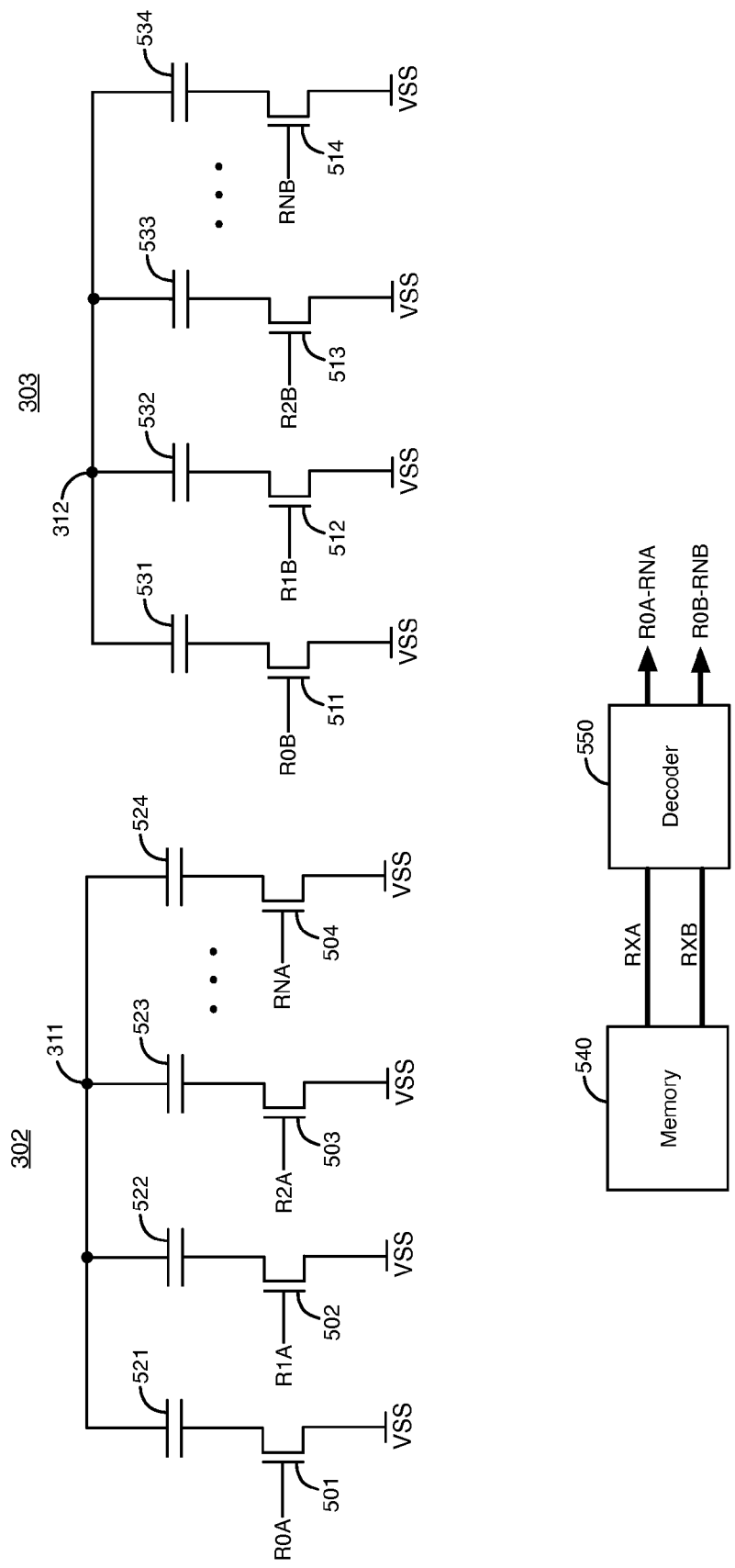
FIG. 5 illustrates examples of variable capacitors in the sense amplifier, according to an embodiment of the present invention.

FIG. 5 illustrates examples of variable capacitors 302 and 303, according to an embodiment of the present invention. In the embodiment of FIG. 5, variable capacitor 302 includes an N number of capacitors and the same number N of n-channel MOSFETs. Variable capacitor 303 also includes an N number of capacitors and the same number N of n-channel MOSFETs. Each capacitor in variable capacitors 302 and 303 is coupled in series between an output node of sense amplifier 300 and one of the n-channel MOSFETs. The drain of each n-channel MOSFET is coupled to one of the capacitors, and the source of each n-channel MOSFET is coupled to receive a ground voltage VSS.

Variable capacitors 302 and 303 can include any desired number N of capacitors and a corresponding number of transistors. Four capacitors 521-524 and four n-channel transistors 501-504 are shown in FIG. 5 merely as an example for variable capacitor 302. Also, four capacitors 531-534 and four n-channel transistors 511-514 are shown in FIG. 5 merely as an example for variable capacitor 303. The capacitances of capacitors 521-524 and 531-534 are constant, except when the temperature of the capacitors changes.

Each of the capacitors 521-524 is coupled to output node 311 of sense amplifier 300, and each of the capacitors 531-534 is coupled to output node 312 of sense amplifier 300.

FIG. 5 also shows memory circuit 540 and decoder circuit 550. Memory 540 and decoder circuit 550 are typically located on the same integrated circuit as sense amplifier 300. Control circuit 211 selects logic states for control signals R0A-RNA and R0B-RNB based on the results of the tests of amplifier 300. In a programmable logic integrated circuit such as an FPGA, the tests of amplifier 300 are performed during the configuration mode of the integrated circuit.

After the tests are completed, control circuit 211 encodes signals R0A-RNA and R0B-RNB using a binary encoding technique to generate encoded signals RXA and RXB, respectively. Signals RXA and RXB are then stored in memory circuit 540. Decoder circuit 550 receives the first set of binary encoded digital signals RXA and the second set of binary encoded digital signals RXB from memory circuit 540.

Signals RXA include a $\log_2(N)$ number of digital signals that are transmitted to decoder 550. Signals RXB also include a $\log_2(N)$ number of digital signals that are transmitted to decoder 550. During the user mode of a programmable logic integrated circuit, decoder 550 decodes signals RXA to generate an N number of decoded digital signals R0A-RNA using a binary decoding technique, and decoder 550 decodes signals RXB to generate an N number of decoded digital signals R0B-RNB using the binary decoding technique. Decoder 550 transmits decoded signals R0A-RNA and R0B-RNB to capacitors 302-303.

The binary value of signals RXA determines how many of transistors 501-504 in variable capacitor 302 will be turned on after signals RXA are decoded. The binary value of signals RXB determines how many of transistors 511-514 in variable capacitor 303 will be turned on after signals RXB are decoded. The binary value of signals RXA equals the number of decoded signals R0A-RNA that are in logic high states. The binary value of signals RXB equals the number of decoded signals R0B-RNB that are in logic high states. The remaining signals R0A-RNA and R0B-RNB are in logic low states.

Signal R0A is transmitted to the gate of transistor 501, signal R1A is transmitted to the gate of transistor 502, signal R2A is transmitted to the gate of transistor 503, and signal RNA is transmitted to the gate of transistor 504, as shown in FIG. 5. Signal R0B is transmitted to the gate of transistor 511, signal R1B is transmitted to the gate of transistor 512, signal R2B is transmitted to the gate of transistor 513, and signal RNB is transmitted to the gate of transistor 514, as shown in FIG. 5. When one of the signals R0A-RNA or R0B-RNB is in a logic high state, the corresponding n-channel transistor in the variable capacitor that is controlled by that signal is on. When one of the signals R0A-RNA or R0B-RNB is in a logic low state, the corresponding n-channel transistor in the variable capacitor that is controlled by that signal is off.

The capacitance at output node 311 changes in response to changes in the logic states of digital signals R0A-RNA. Changing the logic states of digital signals R0A-RNA causes more or less of the transistors 501-504 in variable capacitor 302 to be turned on. For example, the number of signals R0A-RNA that are in logic high states can be increased to increase the number of transistors 501-504 that are on, causing the capacitance at node 311 to increase. The number of signals R0A-RNA that are in logic high states can be decreased to decrease the number of transistors 501-504 that are on, causing the capacitance at node 311 to decrease.

The capacitance at output node 312 changes in response to changes in the logic states of digital signals R0B-RNB. Changing the logic states of digital signals R0B-RNB causes more or less of the transistors 511-514 in variable capacitor 303 to be turned on. For example, the number of signals R0B-RNB that are in logic high states can be increased to increase the number of transistors 511-514 that are on, causing the capacitance at node 312 to increase. The number of signals R0B-RNB that are in logic high states can be decreased to decrease the number of transistors 511-514 that are on, causing the capacitance at node 312 to decrease.

According to an alternative embodiment of the present invention, varactor circuits can be used to implement variable capacitors 302 and 303. The varactors can be reverse-biased diodes or MOS varactors. MOS varactors are n-channel MOSFETs in which the bulk region is not p-type. The bulk region in a MOS varactor is in an N-type well, instead of a p-type substrate. According to another embodiment of the present invention, well-controlled metal capacitors can be used to implement variable capacitors 302 and 303. Well-controlled metal capacitors can provide fine granularity to the capacitance tuning of capacitors 302 and 303.

After an integrated circuit die has been manufactured to have receiver 203 and sense amplifier 300 coupled as shown in FIGS. 2-3, tests can be performed to determine if an offset in one or both of receiver 203 and sense amplifier 300 affects the logic state of OUT/OUTB. During the tests, control circuit 211 compares the logic state of the differential output signal OUT/OUTB to the test sequence. The test sequence represents the pattern of logic states of differential input signal R1/R2 that are applied to pads 204-205 during the tests. If the logic state of the differential output signal OUT/OUTB does not equal the logic state of the differential input signal R1/R2 as represented by the test sequence, control circuit 211 varies the capacitance of at least one of variable capacitors 302-303, until the logic state of OUT/OUTB equals the logic state of R1/R2.

The capacitance of one of variable capacitors 302 or 303 can be increased or decreased in increments until the logic states of R1/R2 and OUT/OUTB are equal. For example, control circuit 211 can increase or decrease the number of is (i.e., signals in logic high states) among signals R0A-RNA or among signals R0B-RNB by one to add or remove an additional capacitor to/from the corresponding output node 311/312 by turning on/off a corresponding transistor. Control circuit 211 then measures output signal OUT/OUTB again. If control circuit 211 determines that the differential output signal OUT/OUTB has flipped to the correct logic state, the logic states of the R0A-RNA and R0B-RNB signals are encoded as signals RXA and RXB, respectively, and signals RXA and RXB are subsequently stored in memory 540. Signals RXA and RXB are used to program the transistors in variable capacitors 302 and 303 during circuit operation (e.g., user mode in an FPGA).

If the differential output signal OUT/OUTB has not flipped to the correct logic state, control circuit 211 adds or removes another capacitor to/from the corresponding output node 311/312. Additional capacitors are added to or removed from the corresponding output node, until control circuit 211 senses that the logic state of OUT/OUTB is the same as the logic state of R1/R2. The binary values of RXA and RXB are subsequently stored in memory and used to program the transistors in variable capacitors 302 and 303 during circuit operation.

Table 1 below shows how process variations in receiver 203 and sense amplifier 300 may change the logic state of the differential output signal OUT/OUTB relative to differential input signal R1/R2.

TABLE 1

| Row | R1/R2 | IN/INB | OUT/OUTB | Results |
|-----|-------|--------|----------|---------|
| 1 | 1 | 0 | 0 | Incorrect, RX offset |
| 2 | 1 | 0 | 1 | Correct, Offset cancellation in SA |
| 3 | 1 | 1 | 0 | Incorrect, SA offset |
| 4 | 1 | 1 | 1 | Correct, offset cancellation in SA or no offset |
| 5 | 0 | 0 | 1 | Incorrect, SA offset |
| 6 | 0 | 0 | 0 | Correct, offset cancellation in SA or no offset |
| 7 | 0 | 1 | 1 | Incorrect, RX offset |
| 8 | 0 | 1 | 0 | Correct, offset cancellation in SA |

An offset in receiver 203 flips the logic state of the IN/INB differential input signal in the examples shown in rows 1 and 7 in Table 1. If the tested logic states of R1/R2 and OUT/OUTB equal the example values shown in row 1 of Table 1, then control circuit 211 can increase the capacitance of variable capacitor 303 or decrease the capacitance of variable capacitor 302, until the logic state of OUT/OUTB equals 1 (i.e., a logic high state) as shown in row 2 of Table 1. If the tested logic states of R1/R2 and OUT/OUTB equal the example values shown in row 7 of Table 1, then control circuit 211 can increase the capacitance of variable capacitor 302 or decrease the capacitance of variable capacitor 303, until the logic state of OUT/OUTB equals 0 (i.e., a logic low state), as shown in row 8 of Table 1.

An offset in sense amplifier (SA) 300 flips the logic state of differential output signal OUT/OUTB in the examples shown in rows 3 and 5 in Table 1. If the tested logic states of R1/R2 and OUT/OUTB equal the example values shown in row 3 of Table 1, then control circuit 211 increases the capacitance of variable capacitor 303 or decreases the capacitance of variable capacitor 302, until the logic state of OUT/OUTB equals 1, as shown in row 4 of Table 1. If the tested logic states of R1/R2 and OUT/OUTB equal the example values shown in row 5 of Table 1, then control circuit 211 increases the capacitance of variable capacitor 302 or decreases the capacitance of variable capacitor 303, until the logic state of OUT/OUTB equals 0, as shown in row 6 of Table 1.

Rows 4 and 6 of Table 1 also show the logic states of the differential signals in the situations where neither the receiver 203 nor the sense amplifier 300 have offsets that flip the logic states of their differential output signal relative to their differential input signal.

Figure 6:
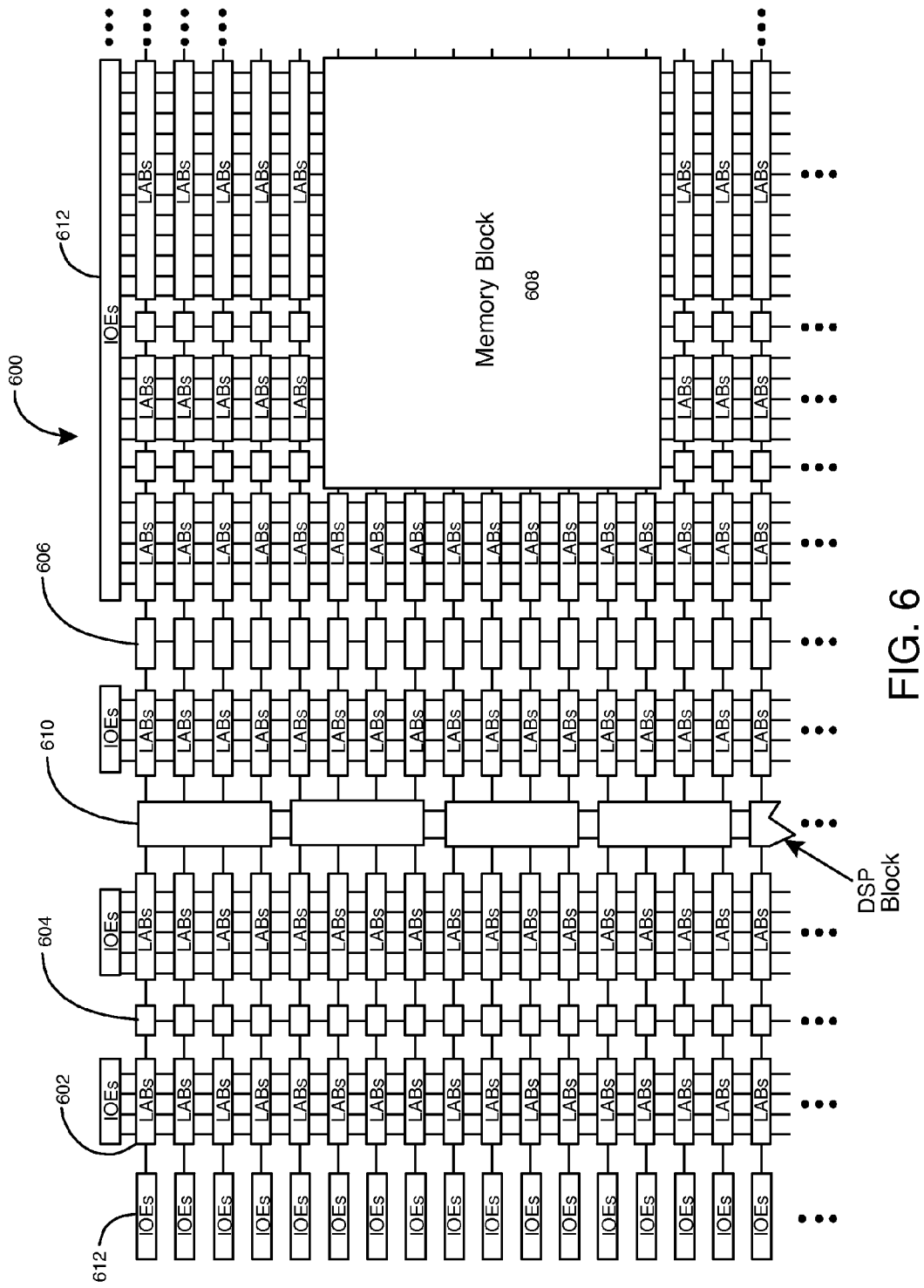
FIG. 6 is a simplified partial block diagram of a field programmable gate array (FPGA) that can include aspects of the present invention.

FIG. 6 is a simplified partial block diagram of a field programmable gate array (FPGA) 600 that can include aspects of the present invention. FPGA 600 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 600 includes a two-dimensional array of programmable logic array blocks (or LABs) 602 that are interconnected by a network of column and row interconnect conductors of varying length and speed. LABs 602 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 600 also includes a distributed memory structure including random access memory (RAM) blocks of varying sizes provided throughout the array. The RAM blocks include, for example, blocks 604, blocks 606, and block 608. These memory blocks can also include shift registers and first-in-first-out (FIFO) buffers.

FPGA 600 further includes digital signal processing (DSP) blocks 610 that can implement, for example, multipliers with add or subtract features. Input/output elements (IOEs) 612 located, in this example, around the periphery of the chip, support numerous single-ended and differential input/output standards. IOEs 612 are coupled to pads. Each of the pads is an external terminal of the FPGA. It is to be understood that FPGA 600 is described herein for illustrative purposes only and that the present invention can be implemented in many different types of PLDs, FPGAs, and ASICs.

Figure 7:
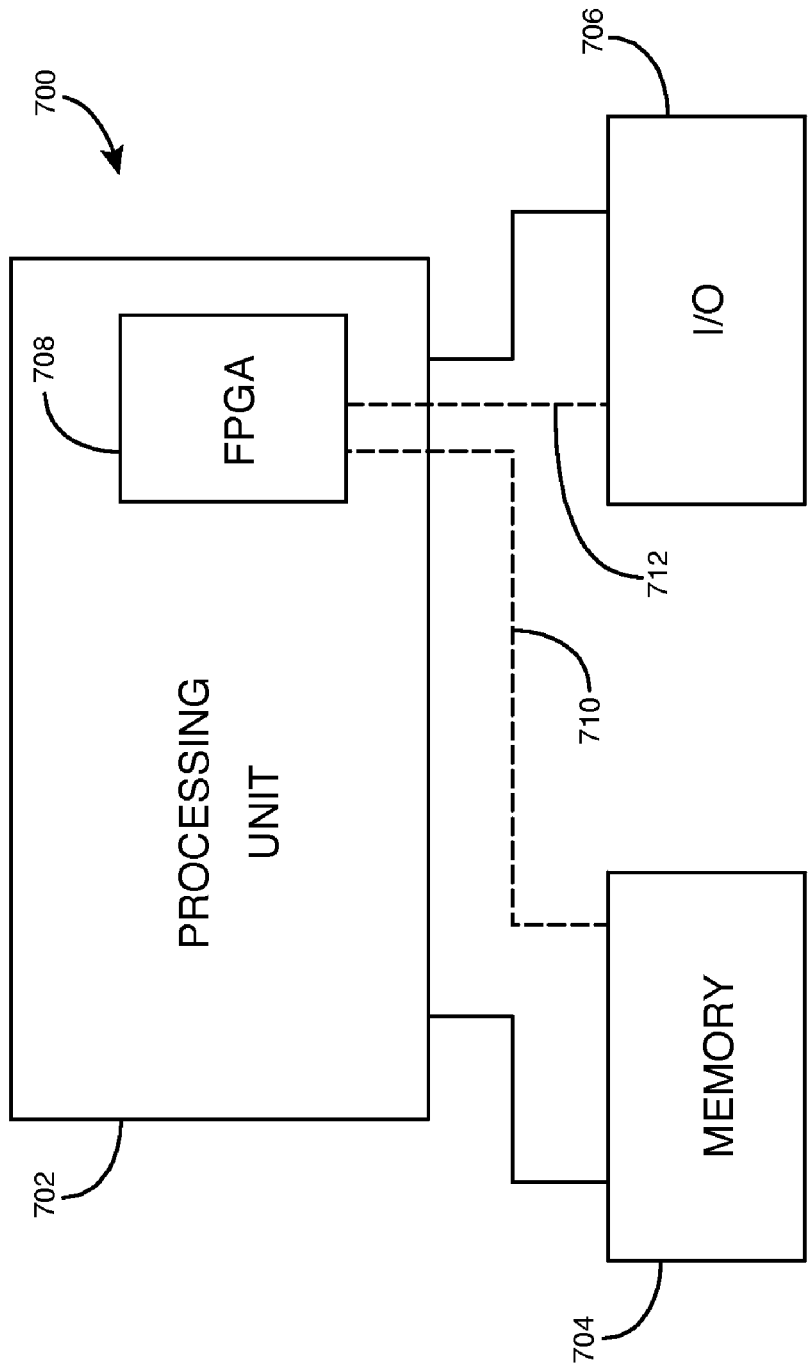
FIG. 7 shows a block diagram of an exemplary digital system that can embody techniques of the present invention.

The present invention can also be implemented in a system that has an FPGA as one of several components. FIG. 7 shows a block diagram of an exemplary digital system 700 that can embody techniques of the present invention. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704, and an input/output (I/O) unit 706 interconnected together by one or more buses. According to this exemplary embodiment, an FPGA 708 is embedded in processing unit 702. FPGA 708 can serve many different purposes within the system of FIG. 7. FPGA 708 can, for example, be a logical building block of processing unit 702, supporting its internal and external operations. FPGA 708 is programmed to implement the logical functions necessary to carry on its particular role in system operation. FPGA 708 can be specially coupled to memory 704 through connection 710 and to I/O unit 706 through connection 712.

Processing unit 702 can direct data to an appropriate system component for processing or storage, execute a program stored in memory 704, receive and transmit data via I/O unit 706, or other similar functions. Processing unit 702 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 708 can control the logical operations of the system. As another example, FPGA 708 acts as a reconfigurable processor that can be reprogrammed as needed to handle a particular computing task. Alternatively, FPGA 708 can itself include an embedded microprocessor. Memory unit 704 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
a differential circuit generating a differential output signal at first and second output nodes;
a first variable capacitor coupled to the first output node of the differential circuit;
a second variable capacitor coupled to the second output node of the differential circuit; and
a control circuit that controls capacitances of the first and the second variable capacitors in response to a measurement of the differential output signal.

2. The circuit defined in claim 1 further comprising:
a receiver circuit coupled to generate an intermediate differential signal in response to receiving a differential input signal,
wherein the differential circuit is an amplifier, the intermediate differential signal is transmitted to differential input nodes of the amplifier, and wherein the control circuit selects capacitances of the first and the second variable capacitors to cause the logic state of the differential output signal to have a predetermined relationship with the logic state of the differential input signal in response to the measurement of the differential output signal.

3. The circuit defined in claim 1 wherein each of the first and the second variable capacitors comprises:
capacitors; and
transistors, wherein each of the transistors is coupled in series with one of the capacitors.

4. The circuit defined in claim 3 wherein the control circuit further comprises a decoder that decodes encoded control signals to generate decoded control signals, and wherein the decoded control signals are transmitted to input terminals of the transistors.

5. The circuit defined in claim 1 wherein the first variable capacitor is a first varactor, and the second variable capacitor is a second varactor.

6. The circuit defined in claim 1 wherein the differential circuit is an amplifier, and the amplifier comprises:
a differential pair of transistors; and
first and second cross-coupled inverter circuits that are coupled to the differential pair.

7. The circuit defined in claim 6 wherein the amplifier further comprises a transistor coupled to a drain of each of the transistors in the differential pair of transistors.

8. The circuit defined in claim 1 wherein the first variable capacitor is coupled between the first output node of the differential circuit and a node that receives a ground voltage, and wherein the second variable capacitor is coupled between the second output node of the differential circuit and the node that receives the ground voltage.

9. The circuit defined in claim 2 wherein the receiver circuit, the amplifier, the first and the second variable capacitors, and the control circuit are fabricated on a programmable logic integrated circuit.

10. A circuit comprising:
an amplifier generating a differential output signal at first and second output nodes;
a first variable capacitor coupled between the first output node of the amplifier and a node that receives a ground voltage; and
a second variable capacitor coupled between the second output node of the amplifier and the node that receives the ground voltage;
a control circuit that varies capacitances of the first and the second variable capacitors in response to a measurement of the differential output signal.

11. The circuit defined in claim 10 further comprising:
a receiver circuit coupled to generate an intermediate differential signal in response to receiving a differential input signal, wherein the intermediate differential signal is transmitted to differential input nodes of the amplifier,
wherein the control circuit selects capacitances of the first and the second variable capacitors that change a logic state of the differential output signal in response to a measurement of the differential output signal indicating that the differential output signal does not have a particular relationship with the differential input signal.

12. The circuit defined in claim 10 wherein the first variable capacitor comprises first capacitors and first transistors, each of the first transistors being coupled to one of the first capacitors, and wherein the second variable capacitor comprises second capacitors and second transistors, each of the second transistors being coupled to one of the second capacitors.

13. The circuit defined in claim 10 wherein the first variable capacitor is a first varactor, and the second variable capacitor is a second varactor.

14. The circuit defined in claim 10 wherein the amplifier comprises:
a differential pair of transistors; and
a transistor coupled to a drain of each of the transistors in the differential pair of transistors.

15. The circuit defined in claim 10 wherein the circuit is a programmable logic integrated circuit.

16. The circuit defined in claim 11 wherein the receiver circuit is an amplifier circuit.

17. The circuit defined in claim 11 wherein a first input terminal of the receiver circuit is coupled to a first external terminal of the circuit, and the second input terminal of the receiver circuit is coupled to a second external terminal of the circuit, the differential input signal being applied across the first and the second external terminals.

18. A method comprising:
amplifying a differential intermediate signal in response to a differential input signal;
amplifying a differential output signal across first and second variable capacitors in response to the differential intermediate signal;
comparing a logic state of the differential output signal to a logic state of the differential input signal; and
if the logic state of the differential output signal does not have a particular relationship with the logic state of the differential input signal, adjusting a capacitance of at least one of the first and the second variable capacitors to change the logic state of the differential output signal.

19. The method defined in claim 18 wherein adjusting a capacitance of at least one of the first and the second variable capacitors to change the logic state of the differential output signal further comprises increasing a capacitance of the first variable capacitor.

20. The method defined in claim 19 wherein adjusting a capacitance of at least one of the first and the second variable capacitors to change the logic state of the differential output signal further comprises increasing a capacitance of the second variable capacitor.

21. A circuit comprising:
   means for amplifying a differential output signal across first and second output nodes in response to a first differential input signal;
   means for providing a first variable capacitance at the first output node;
   means for providing a second variable capacitance at the second output node; and
   means for varying the first and the second variable capacitances in response to a measurement of the differential output signal.

22. The circuit defined in claim 21 further comprising:
   means for amplifying the first differential input signal in response to a second differential input signal,
   wherein the means for varying selects the first and the second variable capacitances to cause a logic state of the differential output signal to have a predetermined relationship with a logic state of the second differential input signal to compensate for a process variation in the circuit affecting rise and fall times of voltages at the first and the second output nodes.

23. The circuit defined in claim 21 wherein the means for providing the first variable capacitance is coupled between the first output node and a node that receives a ground voltage, and wherein the means for providing the second variable capacitance is coupled between the second output node and the node that receives the ground voltage.

* * * * *